(12) United States Patent
Kurokawa

(10) Patent No.: US 12,272,393 B2
(45) Date of Patent: Apr. 8, 2025

(54) OPTICAL RECORDING MEDIUM, MANUFACTURING METHOD THEREOF, RECORDING MATERIAL FOR OPTICAL RECORDING MEDIUM, AND SPUTTERING TARGET FOR OPTICAL RECORDING MEDIUM

(71) Applicant: SONY GROUP CORPORATION, Tokyo (JP)

(72) Inventor: Kotaro Kurokawa, Tokyo (JP)

(73) Assignee: SONY GROUP CORPORATION, Tokyo (JP)

( * ) Notice: Subject to any disclaimer, the term of this patent is extended or adjusted under 35 U.S.C. 154(b) by 0 days.

(21) Appl. No.: 18/546,020

(22) PCT Filed: Feb. 28, 2022

(86) PCT No.: PCT/JP2022/008194
§ 371 (c)(1),
(2) Date: Aug. 10, 2023

(87) PCT Pub. No.: WO2022/186117
PCT Pub. Date: Sep. 9, 2022

(65) Prior Publication Data
US 2024/0062781 A1 Feb. 22, 2024

(30) Foreign Application Priority Data
Mar. 1, 2021 (JP) ................. 2021-032019

(51) Int. Cl.
*G11B 7/243* (2013.01)
*G11B 7/26* (2006.01)

(52) U.S. Cl.
CPC ............. *G11B 7/243* (2013.01); *G11B 7/266* (2013.01); *G11B 2007/24314* (2013.01)

(58) Field of Classification Search
CPC .................................................. G11B 7/2433
See application file for complete search history.

(56) References Cited

U.S. PATENT DOCUMENTS

| 2010/0020668 A1* | 1/2010 | Narumi | ................ G11B 7/0062 |
| 2012/0176883 A1* | 7/2012 | Tauchi | ................ C23C 14/3414 |
| | | | 369/283 |

FOREIGN PATENT DOCUMENTS

| JP | 2011-034611 A | 2/2011 |
| JP | 2012-139876 A | 7/2012 |
| JP | 2014-173149 A | 9/2014 |
| JP | 2015-032340 A | 2/2015 |
| JP | 6308128 B2 | 4/2018 |

OTHER PUBLICATIONS

International Search Report and Written Opinion of PCT Application No. PCT/JP2022/008194, issued on May 10, 2022, 09 pages of ISRWO.

* cited by examiner

*Primary Examiner* — Elizabeth E Mulvaney
(74) *Attorney, Agent, or Firm* — CHIP LAW GROUP

(57) ABSTRACT

Provided is an optical recording medium capable of shortening tact time. The optical recording medium includes at least one recording layer. The recording layer contains an oxide of Bi.

13 Claims, 15 Drawing Sheets

OPTICAL RECORDING MEDIUM, MANUFACTURING METHOD THEREOF, RECORDING MATERIAL FOR OPTICAL RECORDING MEDIUM, AND SPUTTERING TARGET FOR OPTICAL RECORDING MEDIUM

CROSS REFERENCE TO RELATED APPLICATIONS

This application is a U.S. National Phase of International Patent Application No. PCT/JP2022/008194 filed on Feb. 28, 2022, which claims priority benefit of Japanese Patent Application No. JP 2021-032019 filed in the Japan Patent Office on Mar. 1, 2021. Each of the above-referenced applications is hereby incorporated herein by reference in its entirety.

TECHNICAL FIELD

The present disclosure relates to an optical recording medium, a manufacturing method thereof, a recording material for an optical recording medium, and a sputtering target for an optical recording medium.

BACKGROUND ART

In recent years, with the development of the Internet, huge amounts of data have been exchanged. Big data analysis, in which market analysis is performed using a huge amount of data flowing on a network, is also actively performed, and the demand for data storage on the Internet facility side, that is, on the cloud side, is increasing. As recording media for storing cloud data, solid state drives (SSDs) and hard disks (HDs) are mainly used for frequently accessed data, and tape media are mainly used for long-term storage. The latter is called a cold archive. In addition, the demand for long-term storage of huge amounts of data, such as content from a broadcast station and diagnostic images from medical equipment, is increasing as the image quality of television broadcasts, digital video cameras, and the like advances.

An optical disc system is also used as a cold archive, and in the optical disc system, a system and an optical disc with a lower bit unit price (an index obtained by converting the price of the optical disc and its system per unit information amount) are required. In recent years, a low-priced Mn-based oxide has been proposed as a recording material for the above applications in place of an expensive Pd-based oxide, and cost reduction has been promoted (see PTL 1 and 2, for example).

CITATION LIST

Patent Literature

[PTL 1]
JP 6308128B
[PTL 2]
JP 2012-139876A

SUMMARY

Technical Problem

However, a Mn-based oxide is disadvantageous in terms of tact time because it takes a long time to form a film. For this reason, a recording material capable of shortening the tact time is desired.

An object of the present disclosure is to provide an optical recording medium, a manufacturing method thereof, a recording material for an optical recording medium, and a sputtering target for an optical recording medium, which are capable of shortening the tact time.

Solution to Problem

In order to solve the above-described problems, a first disclosure is an optical recording medium including:
at least one recording layer,
wherein the recording layer contains an oxide of Bi.
A second disclosure is
a manufacturing method of an optical recording medium, including:
forming a recording layer by sputtering a target while introducing a process gas,
wherein the target contains an oxide of Bi,
wherein the process gas contains a rare gas and oxygen, and
wherein a flow rate ratio of the oxygen to the rare gas (an oxygen flow rate/a rare gas flow rate) is 0.15 or more.
A third disclosure is
a recording material for an optical recording medium, containing:
an oxide of Bi.
A fourth disclosure is
a sputtering target for an optical recording medium, containing:
an oxide of Bi.

In the present disclosure, it is preferable that at least one recording layer be provided on the substrate and a cover layer be provided on the at least one recording layer. The thickness of the cover layer is not particularly limited, but in the high-density optical recording medium, an objective lens with a high numerical aperture (NA) is used, and thus it is preferable that a thin light transmitting layer such as a sheet or coating layer be used as the cover layer and the recording and the reproducing of an information signal be performed by emitting light from a side of this light transmitting layer. In this case, it is also possible to use a substrate having opacity. The surface on which light for recording or reproducing an information signal is incident is appropriately set on at least one of the surface on the side of the cover layer and the surface on the side of the substrate according to the format of the optical recording medium.

In the present disclosure, from the viewpoint of improving storage reliability, the optical recording medium preferably further includes a protective layer on at least one surface of the recording layer and more preferably further includes protective layers on both surfaces of the recording layer. From the viewpoint of layer configuration and simplification of manufacturing equipment, it is preferable to use the recording layer alone without providing a protective layer on any surface of the recording layer.

In the present disclosure, in a case where the optical recording medium includes a plurality of information signal layers each including a recording layer and a protective layer provided on at least one surface side of the recording layer, from the viewpoint of productivity, the plurality of information signal layers preferably all have the same layer configuration. In a case where a plurality of information signal layers have the same layer configuration including a first protective layer, a recording layer, and a second protective layer, from the viewpoint of productivity, each of the first protective layer, the recording layer, and the second protective layer preferably contains the same type of material in all the information signal layers.

DESCRIPTION OF EMBODIMENTS

Figure 1A:
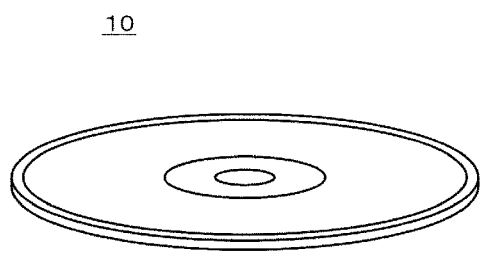
FIG. 1A is a perspective view showing an example of an appearance of an optical recording medium according to an embodiment of the present disclosure.

An embodiment and examples of the present disclosure will be described in the following order.
1. Embodiment
1-1. Configuration of Optical Recording Medium
1-2. Recording Principle of Optical Recording Medium
1-3. Sputtering Target
1-4. Manufacturing Method of Optical Recording Medium
1-5. Operations and Effects
1-6. Modification Example
2. Examples
2-1. Evaluation Device and Evaluation Method of Signal Characteristics
2-2. Metal Oxide to Replace Mn-based Oxide
2-3. Influence of Additive Element on Recorded and Reproduced Signal Quality
2-4. Sputtering Gas Conditions of Bi-based Oxide
2-5. Amount of Oxide of Bi for Ensuring Excellent Recorded and Reproduced Signal Characteristics 1. Embodiment 1-1. Configuration of Optical Recording Medium FIG. 1A is a perspective view showing an example of an appearance of an optical recording medium 10 according to an embodiment of the present disclosure. The optical recording medium 10 has a disc shape with an opening in the center (hereinafter referred to as a "center hole"). The shape of the optical recording medium 10 is not limited to this example, and a card shape or the like is also possible.

Figure 1B:
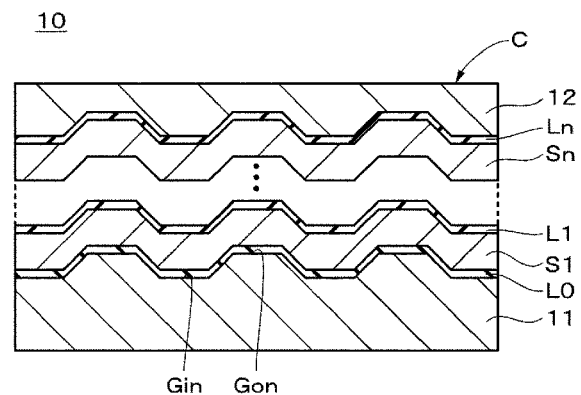
FIG. 1B is a schematic cross-sectional view showing an example of a configuration of the optical recording medium according to the embodiment of the present disclosure.

FIG. 1B is a schematic cross-sectional view showing an example of a configuration of the optical recording medium 10 according to the embodiment of the present disclosure. This optical recording medium 10 is a so-called multi-layer write-once type optical recording medium and includes a substrate 11, an information signal layer L0, an intermediate layer S1, an information signal layer L1, . . . , an intermediate layer Sn, an information signal layer Ln, and a light transmitting layer 12 as a cover layer in that order, as shown in FIG. 1B. In the following description, in a case where the information signal layers L0 to Ln are not particularly distinguished, they will be referred to as an information signal layer L.

In the optical recording medium 10 according to this embodiment, when laser light is emitted from a surface C on a side of the light transmitting layer 12 to the information signal layers L0 to Ln, an information signal is recorded or reproduced. For example, when laser light in a wavelength range of 400 nm or more and 410 nm or less is condensed by an objective lens having a numerical aperture in a range of 0.84 or more and 0.86 or less and emitted from the side of the light transmitting layer 12 to the information signal layers L0 to Ln, an information signal is recorded or reproduced. Examples of such an optical recording medium 10 include a multi-layer BD-R. The above wavelength and numerical aperture ranges are examples, and the wavelength of the laser light and the numerical aperture of the objective lens are not limited to the above wavelength and numerical aperture ranges and may be outside the above wavelength and numerical aperture ranges.

Hereinafter, the substrate 11, the information signal layers L0 to Ln, the intermediate layers S1 to Sn, and the light transmitting layer 12, which constitute the optical recording medium 10, will be sequentially described.

(Substrate)

The substrate 11 has, for example, a disc shape having a center hole in the center. One principal surface of the substrate 11 is, for example, an uneven surface, and the information signal layer L0 is formed on this uneven surface. Hereinafter, in the uneven surface, concave portions will be referred to as lands Gin, and convex portions will be referred to as grooves Gon.

Examples of the shape of the lands Gin and the grooves Gon include various shapes such as a spiral shape and a concentric circle shape. In addition, the lands Gin and/or the grooves Gon may be wobbled (meandered) to stabilize a linear velocity, add address information, and the like.

The diameter of the substrate 11 is selected to be 120 mm, for example. The thickness of the substrate 11 is selected in consideration of rigidity, is preferably 0.3 mm or more and 1.3 mm or less, more preferably 0.6 mm or more and 1.3 mm or less, and is selected to be 1.1 mm, for example. In addition, the diameter of the center hole is selected to be 15 mm, for example.

As the material of the substrate 11, for example, a plastic material or glass can be used, and from the viewpoint of cost, it is preferable to use a plastic material. As the plastic material, for example, a polycarbonate-based resin, a polyolefin-based resin, an acrylic-based resin, or the like can be used.

(Information Signal Layer)

The information signal layers L0 to Ln include at least a recording layer configured to record an information signal by irradiation with laser light. For example, the information signal layers L0 to Ln have a recording capacity of 25 GB or more for a wavelength of 405 nm and a numerical aperture NA of 0.85 of a condensing lens. From the viewpoint of improving storage reliability, the information signal layers L0 to Ln preferably further include a protective layer on at least one surface of the recording layer and more preferably further include protective layers on both surfaces of the recording layer. The layer configuration of the information signal layers L0 to Ln may be the same for all layers, and the layer configuration may be changed according to the characteristics (for example, optical characteristics, durability, and the like) required for each of the information signal layers L0 to Ln. From the viewpoint of productivity, it is preferable that all layers have the same layer configuration. The information signal layers L0 to Ln may be constituted by a single recording layer. With such a simple configuration, it is possible to reduce the cost of the optical recording medium 10, and it is possible to improve the productivity thereof. Such an effect becomes more significant as the medium has a larger number of information signal layers L0 to Ln.

First to fourth configuration examples will be described below as specific examples of the information signal layers L0 to Ln.

First Configuration Example

Figure 2A:
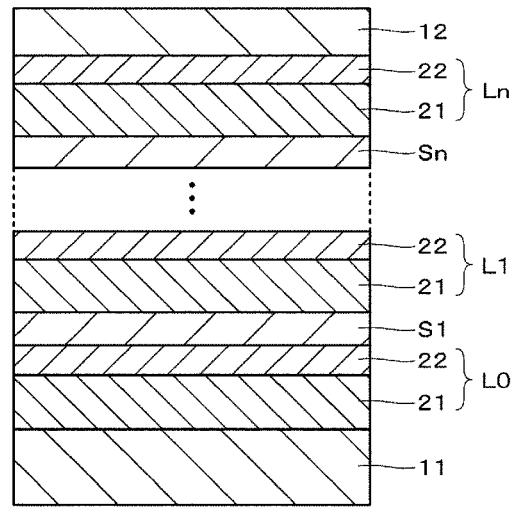
FIG. 2A is a schematic view showing a first configuration example of each information signal layer.

FIG. 2A is a schematic view showing a first configuration example of each information signal layer L. As shown in FIG. 2A, the information signal layers L0 to Ln include a recording layer 21 having an upper surface (a second principal surface) and a lower surface (a first principal surface) and a protective layer 22 provided adjacent to the upper surface of the recording layer 21. With such a configuration, it is possible to improve the durability of the recording layer 21.

Second Configuration Example

Figure 2B:
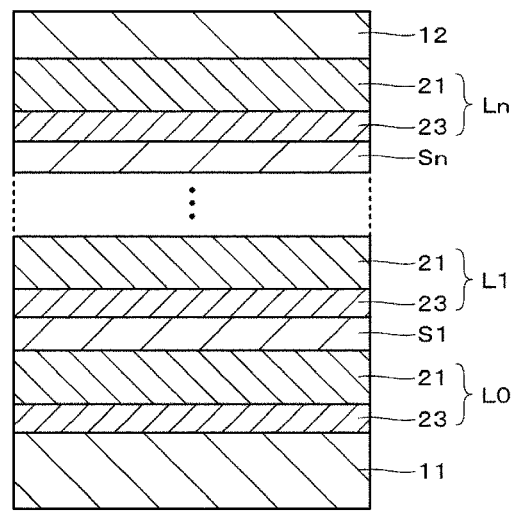
FIG. 2B is a schematic view showing a second configuration example of each information signal layer.

FIG. 2B is a schematic view showing a second configuration example of each information signal layer L. As shown in FIG. 2B, the information signal layers L0 to Ln include a recording layer 21 having an upper surface (a second principal surface) and a lower surface (a first principal surface) and a protective layer 23 provided adjacent to the lower surface of the recording layer 21. With such a configuration, it is possible to improve the durability of the recording layer 21.

Third Configuration Example

Figure 3A:
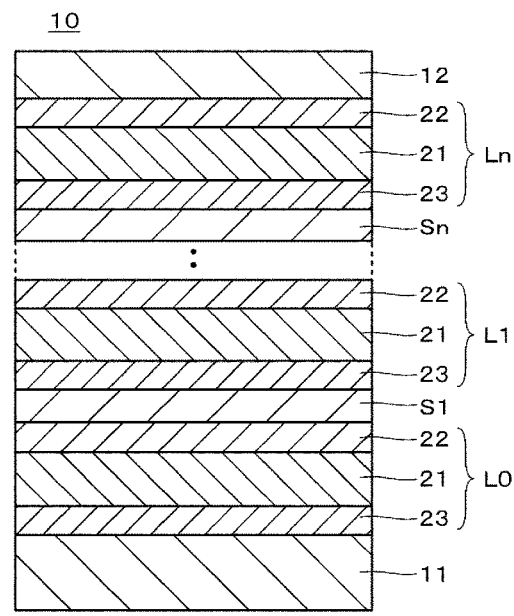
FIG. 3A is a schematic view showing a third configuration example of each information signal layer.

FIG. 3A is a schematic view showing a third configuration example of each information signal layer L. As shown in FIG. 3A, the information signal layers L0 to Ln include a recording layer 21 having an upper surface (a second principal surface) and a lower surface (a first principal surface), a protective layer 23 provided adjacent to the lower surface of the recording layer 21, and a protective layer 22 provided adjacent to the upper surface of the recording layer 21. With such a configuration, it is possible to improve the durability of the recording layer 21 as compared with the first and second configuration examples.

Fourth Configuration Example

Figure 3B:
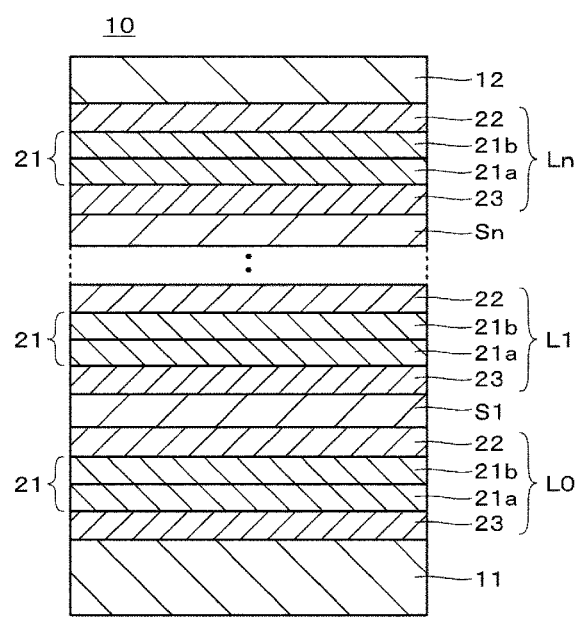
FIG. 3B is a schematic view showing a fourth configuration example of each information signal layer.

FIG. 3B is a schematic view showing a fourth configuration example of each information signal layer L. As shown in FIG. 3B, the information signal layers L0 to Ln have, for example, a two-layer structure in which a recording layer 21a and a recording layer 21b are stacked. The recording layer 21a and the recording layer 21b have different material compositions, for example.

(Recording Layer)

The recording layer 21 contains an oxide of Bi as a recording material. The recording layer 21 may further contain an oxide of a metal M other than Bi. In a case where the recording layer 21 contains an oxide of a metal M, Bi and the metal M may form a composite oxide. The metal M includes at least one selected from the group consisting of Mg, Al, Si, Ti, V, Cr, Mn, Fe, Co, Ni, Cu, Zn, Ga, Ge, Se, Y, Zr, Nb, Mo, Ru, Pd, Ag, In, Sn, Sb, Te, Hf, Ta, W, Pb, and the like, for example. From the viewpoint of improving reproduced signal quality, the metal M preferably contains at least one selected from the group consisting of Cu, Zr, Nb, Sn, Ta, W, Ge, In, Sb, and Mo and more preferably contains at least one selected from the group consisting of Al, Ga, and Zn.

A thickness of the recording layer 21 is, for example, 10 nm or more and 100 nm or less. A content of the oxide of Bi in the recording layer 21 is preferably 10 nm or more in terms of a film thickness of a thin film. When the content of the oxide of Bi in the recording layer 21 is 10 nm or more in terms of a film thickness of a thin film, it is possible to ensure the optical energy absorption capability required for recording.

In a case where the recording layer 21 contains an oxide of Al, a content of the oxide of Al in the recording layer 21 is preferably 15 vol % or more and 50 vol % or less and more preferably 17 vol % or more and 50 vol % or less. When the content of the oxide of Al in the recording layer 21 is 15 vol % or more and 50 vol % or less, it is possible to improve the reproduced signal quality. In addition, desirable optical characteristics (reflectance, transmittance, and the like) of the recording layer 21 of the information signal layers L0 to Ln can be obtained.

In a case where the recording layer 21 contains an oxide of Ga, a content of the oxide of Ga in the recording layer 21 is preferably 17 vol % or more and 67 vol % or less and more preferably 33 vol % or more and 67 vol % or less. When the content of the oxide of Ga in the recording layer 21 is 17 vol % or more and 67 vol % or less, it is possible to improve the reproduced signal quality. In addition, desirable optical characteristics (reflectance, transmittance, and the like) of the recording layer 21 of the information signal layers L0 to Ln can be obtained.

In a case where the recording layer 21 contains an oxide of Zn, a content of the oxide of Zn in the recording layer 21 is preferably 17 vol % or more and 55 vol % or less and more preferably 17 vol % or more and 50 vol % or less. When the content of the oxide of Zn in the recording layer 21 is 17 vol % or more and 55 vol % or less, it is possible to improve the reproduced signal quality. In addition, desirable optical characteristics (reflectance, transmittance, and the like) of the recording layer 21 of the information signal layers L0 to Ln can be obtained.

In the present specification, the content of the oxide of the metal M in the recording layer 21 is indicated by volume ratio (vol %). In general, the content of a material in the recording layer 21 is often expressed in terms of a molar ratio. However, even if the molar ratio is the same, when the type of the oxide of the metal M changes, the mole number of the oxide of Bi in the recording layer 21 changes greatly, and thus the volume ratio is employed. In calculation of the volume ratio, in a case where the oxide of Bi is $Bi_2O_3$, the amount of $Bi_2O_3$ in the recording layer 21 is T(BiOx) in terms of a film thickness, and the amount of the oxide of the metal M is T(MOx) in terms of a film thickness, the volume ratio of the oxide of the metal M is calculated as in the following expression.

Volume ratio (vol %) of oxide of metal M=T(MOx)/ [T(MOx)+T(BiOx)]

As described above, the content of the material in the recording layer 21 is generally expressed in terms of the molar ratio. A conversion method from the volume ratio to the molar ratio is as follows. The densities of the oxide of Bi ($Bi_2O_3$) and the oxide of the metal M (MOx) are ρ(BiOx) and ρ(MOx), and the chemical formula weights are MW(BiOx) and MW(MOx). The mole number of each metal oxide is proportional to T×ρ/MW. The relative mole numbers Mol(BiOx) and Mol(MOx) of each metal oxide are determined according to the following expressions.

Mol(BiOx)=T(BiOx)×ρ(BiOx)/MW(BiOx)

Mol(MOx)=T(MOx)×ρ(MOx)/MW(mOx)

The molar ratio of the oxide of the metal M is determined according to the following expression.

Molar ratio (mol %) of oxide of metal M=Mol (MOx)/[Mol(MOx)+Mol(BiOx)]×100

For example, the molar ratio of the oxide of Bi is determined according to the following expression.

$Bi_2O_3$ molar ratio (mol %)=Mol(BiOx)/[Mol(MOx)+ Mol(BiOx)]×100

From the viewpoint of shortening the tact time in the manufacturing process of the optical recording medium 10, the recording layer 21 preferably does not contain Mn. From the viewpoint of reducing the manufacturing cost of the optical recording medium 10, the recording layer 21 preferably does not contain Pd. From the viewpoint of reducing the manufacturing cost of the optical recording medium 10 and shortening the tact time in the manufacturing process of the optical recording medium 10, the recording layer 21 preferably contains neither Mn nor Pd.

For example, the recording layer 21 is not limited to a single layer structure and may have a stacked structure of a plurality of layers with different compositions. In a case where the recording layer 21 has a single layer structure, the recording layer 21 has, for example, a composite oxide containing Bi as a main component. In a case where the recording layer 21 has a multi-layer structure, the layers constituting the recording layer 21 contain composite oxides having different material compositions as main components. At least one of them contains a composite oxide containing Bi as a main component.

(Protective Layer)

The protective layer 22 and the protective layer 23 are protective layers that protect the recording layer 21. The protective layer 22 and the protective layer 23 may have a function as a gas barrier layer. The durability of the recording layer 21 can be improved by the protective layer 22 and the protective layer 23 functioning as the gas barrier layer. In addition, by curbing the escape of oxygen from the recording layer 21 and the entry of $H_2O$, it is possible to curb a change in the film quality of the recording layer 21 (mainly detected as a decrease in the reflectance), and it is possible to secure a preferable film quality as the recording layer 21.

The protective layer 22 and the protective layer 23 contain, for example, at least one selected from the group consisting of oxides, nitrides, sulfides, carbides, and fluorides. The protective layer 22 and the protective layer 23 may be formed of the same material, or may be formed of different materials. Examples of the oxides include oxides of at least one element selected from the group consisting of In, Zn, Sn, Al, Si, Ge, Ti, Ga, Ta, Nb, Hf, Zr, Cr, Bi, and Mg. Examples of the nitrides include nitrides of at least one element selected from the group consisting of In, Sn, Ge, Cr, Si, Al, Nb, Mo, Ti, Nb, Mo, Ti, W, Ta, and Zn and preferably include nitrides of at least one element selected from the group consisting of Si, Ge, and Ti. Examples of the sulfides include sulfides of Zn. Examples of the carbides include carbides of at least one element selected from the group consisting of In, Sn, Ge, Cr, Si, Al, Ti, Zr, Ta, and W and preferably include carbides of at least one element selected from the group consisting of Si, Ti, and W. Examples of fluorides include fluorides of at least one element selected from the group consisting of Si, Al, Mg, Ca, and La. Examples of mixtures thereof include $ZnS$—$SiO_2$, $SiO_2$—$In_2O_3$—$ZrO_2$ (SIZ), $SiO_2$—$Cr_2O_3$—$ZrO_2$ (SCZ), $In_2O_3$—$SnO_2$ (ITO), $In_2O_3$—$CeO_2$ (ICO), $In_2O_3$—$Ga_2O_3$ (IGO), $In_2O_3$—$Ga_2O_3$—$ZnO$ (IGZO), $Sn_2O_3$—$Ta_2O_5$ (TTO), $TiO_2$—$SiO_2$, $Al_2O_3$—$ZnO$, $Al_2O_3$—$BaO$, and the like.

(Intermediate Layer)

The intermediate layers S1 to Sn play a role of physically and optically separating the information signal layers L0 to Ln from each other with a sufficient distance and have uneven surfaces on their surfaces. The uneven surface forms, for example, grooves (lands Gin and grooves Gon) having a concentric circle shape or a spiral shape. The thickness of the intermediate layers S1 to Sn is preferably set to 9 μm or more and 50 μm or less. The material of the intermediate layers S1 to Sn is not particularly limited, but it is preferable to use an ultraviolet curable type acrylic resin. In addition, since the intermediate layers S1 to Sn serve as optical paths for laser light for recording or reproducing an information signal in the inner layer, they preferably have sufficiently high light transmittance.

(Light Transmitting Layer)

The light transmitting layer 12 is, for example, a resin layer formed by curing a photosensitive resin such as an ultraviolet curable resin. Examples of a material of this resin layer include an ultraviolet curable acrylic resin. Alternatively, the light transmitting layer 12 may be constituted by a light transmitting sheet having an annulus shape and an adhesion layer for bonding the light transmitting sheet to the substrate 11. The light transmitting sheet is preferably formed of a material having a low absorption capability and specifically preferably formed of a material having transmittance of 90% or more for the laser light used for recording and reproduction. As a material for the light transmitting sheet, for example, a polycarbonate resin material, a polyolefin-based resin (for example, Zeonex (registered trademark)), or the like can be used. As a material for the adhesion layer, for example, an ultraviolet curable resin, a pressure sensitive adhesive (PSA), or the like can be used.

The thickness of the light transmitting layer 12 is preferably selected from the range of 10 μm or more and 177 μm or less and is selected to be 100 μm, for example. When such a thin light transmitting layer 12 is combined with an objective lens having a high numerical aperture (NA) of, for example, about 0.85, high-density recording can be realized.

(Hard Coat Layer)

The optical recording medium 10 may include a hard coat layer on the surface C of the light transmitting layer 12. When the hard coat layer is provided on the surface C of the light transmitting layer 12, the optical recording medium 10 can be protected from mechanical impacts and scratches. In addition, the adhesion of dust, fingerprints, or the like to the surface C of the light transmitting layer 12 can be curbed, and the recording and reproducing quality of information signals can be ensured. The hard coat layer may contain fine silica powder in order to improve mechanical strength. As a resin composition for forming the hard coat layer, for example, a solvent type or non-solvent type ultraviolet curable resin can be used. In order to impart mechanical strength, water repellency, oil repellency, and the like to the hard coat layer, the thickness of the hard coat layer is preferably about 1 μm to several μm.

1-2. Recording Principle of Optical Recording Medium

In the optical recording medium 10 having the above configuration, when the information signal layer L is irradiated with laser light having a center wavelength of, for example, about 405 nm, the recording layer 21 containing the oxide of Bi absorbs the laser light, reacts with the laser light, and expands in volume. The inside of the recording layer 21 expanded in volume becomes bubble-like.

The recording layer 21 is a so-called optical thin film from an optical point of view. The light reflectance of an optical thin film changes depending on the refractive index and the thickness of the thin film. When the recording layer 21 is irradiated with recording light, both the refractive index and the thickness thereof change. Regarding the change in refractive index, it is conceivable that in addition to the decrease in density due to expansion, the change in refractive index also occurs due to the thermal reaction of the recording material. When the recording layer 21 is irradiated with the recording light, a volume change and an optical constant change occur to form a recording mark. A difference in reflectance with respect to reproduction light occurs between the recording mark (a recorded portion) and an unrecorded portion. As a result, it is possible to read the information of the recording mark with the emitting of the reproduction light.

The states of the volume change and the optical constant change of the recording material due to recording are affected by the components of the recording material. For example, it is conceivable that the volume change is divided into expansion in the film thickness direction and expansion in a plane direction of the recording layer, but the degree of expansion in the film thickness direction and the plane direction varies depending on the components of the recording material. The amount of change in the optical constant also varies depending on the components of the recording material.

1-3. Sputtering Target

A sputtering target for forming the recording layer of the optical recording medium 10 (hereinafter simply referred to as a "target") contains Bi or an oxide of Bi. The target may further include a metal M other than Bi or an oxide of a metal M other than Bi. In a case where the target contains an oxide of a metal M, Bi and the metal M may form a composite oxide. The metal M is as described as the material of the recording layer 21.

In a case where the target contains an oxide of Al, a content of the oxide of Al in the target is preferably 15 vol % or more and 50 vol % or less. In a case where the target contains an oxide of Ga, a content of the oxide of Ga in the target is preferably 17 vol % or more and 67 vol % or less. In a case where the target contains an oxide of Zn, a content of the oxide of Zn in the target is preferably 17 vol % or more and 55 vol % or less.

1-4. Manufacturing Method of Optical Recording Medium

Hereinafter, an example of a manufacturing method of the optical recording medium according to the embodiment of the present disclosure will be described.

(Forming Process of Substrate)

First, the substrate 11 having an uneven surface formed on one principal surface is formed. As a method for forming the substrate 11, for example, an injection molding (injection) method, a photopolymerization method (a 2P method: Photo Polymerization), or the like can be used.

(Film Forming Process of Information Signal Layer)

Next, the information signal layer L0 is formed on the substrate 11 by a sputtering method, for example. A specific forming process of the information signal layer L0 varies depending on the configuration of the information signal layer L0. The process of forming the information signal layer L0 in the case where the third configuration example (see FIG. 3A) is adopted as the configuration of the information signal layer L0 will be specifically described below.

(Film Forming Process of Protective Layer)

First, the substrate 11 is transported into a vacuum chamber containing a target for forming a protective layer, and the inside of the vacuum chamber is evacuated to reach a predetermined pressure. After that, while a process gas such as a rare gas or $O_2$ gas is introduced into the vacuum chamber, the target is sputtered to form the protective layer 23 on the substrate 11. As the sputtering method, for example, a radio frequency (RF) sputtering method or a direct current (DC) sputtering method can be used, but the direct current sputtering method is particularly preferable. In the direct current sputtering method, the equipment is cheaper than that of the high-frequency sputtering method and the film-forming rate is higher than that of the high-frequency sputtering method, and thus it is possible to lower the manufacturing cost and improve the productivity. At least one selected from the group consisting of Ar, Kr, and Xe can be used as the rare gas in the film forming process of the protective layer 23.

(Film Forming Process of Recording Layer)

Next, the substrate 11 is transported into a vacuum chamber containing a target for forming a recording layer, and the inside of the vacuum chamber is evacuated to reach a predetermined pressure. After that, while a process gas such as a rare gas or $O_2$ gas is introduced into the vacuum chamber, the target is sputtered to form the recording layer 21 on the protective layer 23. As the target, the above target for forming the recording layer is used. In a case where the target contains the metal M or the oxide of the metal M, the recording layer 21 is formed by sputtering while performing oxygen assist, thereby forming a thin film in which Bi and the oxide of the metal M are mixed at the compound level.

A flow rate ratio of the oxygen to the rare gas (an oxygen flow rate (sccm)/a rare gas flow rate (sccm)) is preferably 0.15 or more. When the flow rate ratio of the oxygen to the rare gas is 0.15 or more, the recording layer 21 can contain an oxide of Bi having an excellent light absorption capability. At least one selected from the group consisting of Ar, Kr, and Xe can be used as the rare gas in the film forming process of the recording layer 21.

(Film Forming Process of Protective Layer)

Next, the substrate 11 is transported into a vacuum chamber containing a target for forming a protective layer, and the inside of the vacuum chamber is evacuated to reach a predetermined pressure. After that, while a process gas such as a rare gas or $O_2$ gas is introduced into the vacuum chamber, the target is sputtered to form the protective layer 22 on the recording layer 21. As the sputtering method, for example, a radio frequency (RF) sputtering method or a direct current (DC) sputtering method can be used, but the direct current sputtering method is particularly preferable.

As described above, the information signal layer L0 is formed on the substrate 11.

(Forming Process of Intermediate Layer)

Next, the ultraviolet curable resin is uniformly applied onto the information signal layer L0 by, for example, a spin coating method. Then, an uneven pattern of a stamper is pressed against the ultraviolet curable resin uniformly applied onto the information signal layer L0, the ultraviolet curable resin is irradiated with an ultraviolet ray and cured, and the stamper is then peeled off. As a result, the uneven pattern of the stamper is transferred to the ultraviolet curable resin, and for example, the intermediate layer S1 in which the lands Gin and the grooves Gon are provided is formed on the information signal layer L0.

(Forming Process of Information Signal Layer and Intermediate Layer)

Next, in the same manner as in the above film forming process of information signal layer L0 and the above forming process of the intermediate layer S1, the information signal layer L1, the intermediate layer S2, the information signal layer L2, . . . , the intermediate layer Sn, and the information signal layer Ln are stacked in that order on the intermediate layer S1.

(Forming Process of Light Transmitting Layer)

Next, a photosensitive resin such as an ultraviolet curable resin is spin-coated on the information signal layer Ln by, for example, a spin coating method, light such as an ultraviolet ray is then emitted to the photosensitive resin, and curing is performed. As a result, the light transmitting layer 12 is formed on the information signal layer Ln. Through the above process, the intended optical recording medium 10 is obtained.

1-5. Operations and Effects

As described above, in the optical recording medium 10 according to the embodiment of the present disclosure, the recording layer 21 contains the oxide of Bi, and thus it is possible to shorten the film formation time of the recording layer 21. As a result, it is possible to shorten the production tact time. That is, it is possible to shorten the time required for mass production. Therefore, it is possible to shorten the bit unit price.

Moreover, when the film formation time of the recording layer 21 is shortened, it is possible to shorten the production cycle of the recording layer 21 without providing a plurality of film forming devices. Therefore, it is possible to reduce the number of film forming devices. From this point of view as well, a reduction in the bit unit price can be expected.

Further, in a case where the recording layer 21 contains at least one selected from the group consisting of a metal oxide of Al, a metal oxide of Ga, and a metal oxide of Zn, high reproduced signal quality can be obtained.

1.6 Modification Example

Although the embodiment of the present disclosure has been described above in detail, the present disclosure is not limited to the above-described embodiment, and various modifications based on the technical spirit of the present disclosure can be made.

For example, the configurations, methods, processes, shapes, materials, numerical values, and the like exemplified in the above embodiment are only examples, and as necessary, different configurations, methods, processes, shapes, materials, numerical values, and the like may be used.

Further, the configurations, methods, processes, shapes, materials, numerical values, and the like of the above embodiment can be combined with each other without departing from the gist of the present disclosure.

Further, in the numerical ranges stated in stages in the above embodiment, the upper limit value or the lower limit value of the numerical range of a certain stage may be replaced with the upper limit value or the lower limit value in the numerical range of another stage.

Further, unless otherwise specified, the materials exemplified in the above embodiment may be used alone or in combination of two or more. Further, the chemical formulas of the compounds and the like are representative ones, and the valences and the like are not limited to the described ones as long as they are general names of the same compound.

Figure 4:
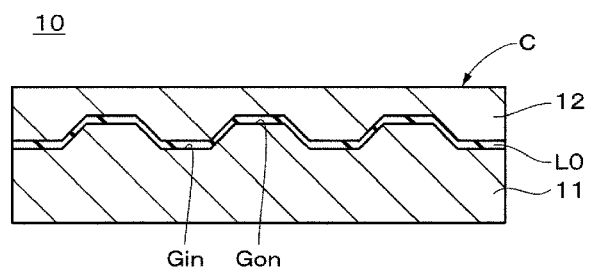
FIG. 4 is a schematic cross-sectional view showing an example of a configuration of an optical recording medium according to a modification example.

Further, in the above embodiment, an example in which the optical recording medium 10 includes the multiple-layer type information signal layer L has been described, but as shown in FIG. 4, the optical recording medium 10 may include a single-layer type information signal layer L0.

Further, in the above embodiment, a case where the present disclosure is applied to the optical recording medium having a configuration in which a plurality of information signal layers and light transmitting layers are stacked in that order on the substrate and in which the information signal is recorded or reproduced by irradiating the information signal layer with the laser light from a side of the light transmitting layer has been described as an example, but the present disclosure is not limited to this example.

The present disclosure can be applied to, for example, an optical recording medium (for example, a compact disc (CD)) having a configuration in which one or a plurality of information signal layers and a protective layer are stacked in that order on a substrate and in which an information signal is recorded or reproduced by irradiating the one or plurality information signal layers with the laser light from a side of the substrate.

The present disclosure can also be applied to an optical recording medium (for example, a digital versatile disc (DVD)) having a configuration in which one or a plurality of information signal layers are provided between two substrates and in which an information signal is recorded or reproduced by irradiating the one or plurality information signal layers with the laser light from a side of one substrate.

The present disclosure can also be applied to an optical recording medium (for example, an archival disc (AD))

having a configuration in which a first disc and a second disc are bonded together, in which an information signal is recorded or reproduced by irradiating the first disc with the laser light from a surface on a side of the first disc, and in which an information signal is recorded or reproduced by irradiating the second disc with the laser light from a surface on a side of the second disc. The first disc and the second disc may have the same layer structure as the optical recording medium 10 according to the above embodiment.

Further, in a case where the optical recording medium has multiple recording layers, the recording layer of the present disclosure may be combined with a recording layer other than the write-once type, such as a ROM layer or a rewritable recording layer. Further, the present disclosure can also be applied to an optical recording medium partially provided with a recording area such as read-only pits.

In addition, the present disclosure may have the following configurations.

(1)
An optical recording medium including:
at least one recording layer,
wherein the recording layer contains an oxide of Bi.

(2)
The optical recording medium according to (1), wherein the recording layer further contains at least one selected from the group consisting of oxides of Mg, Al, Si, Ti, V, Cr, Mn, Fe, Co, Ni, Cu, Zn, Ga, Ge, Se, Y, Zr, Nb, Mo, Ru, Pd, Ag, In, Sn, Sb, Te, Hf, Ta, W, and Pb.

(3)
The optical recording medium according to (1), wherein the recording layer further contains at least one selected from the group consisting of oxides of Cu, Zr, Nb, Sn, Ta, W, Ge, In, Sb, and Mo.

(4)
The optical recording medium according to (1), wherein the recording layer further contains at least one selected from the group consisting of oxides of Al, Ga, and Zn.

(5)
The optical recording medium according to any one of (1) to (4), wherein the recording layer does not contain Mn.

(6)
The optical recording medium according to any one of (1) to (4), wherein the recording layer does not contain Pd.

(7)
The optical recording medium according to any one of (1) to (4), wherein the recording layer does not contain Mn and Pd.

(8)
The optical recording medium according to (1),
wherein the recording layer further contains an oxide of Al, and
wherein a content of the oxide of Al in the recording layer is 15 vol % or more and 50 vol % or less.

(9)
The optical recording medium according to (1),
wherein the recording layer further contains an oxide of Ga, and
wherein a content of the oxide of Ga in the recording layer is 17 vol % or more and 67 vol % or less.

(10)
The optical recording medium according to (1),
wherein the recording layer further contains an oxide of Zn, and
wherein a content of the oxide of Zn in the recording layer is 17 vol % or more and 55 vol % or less.

(11)
The optical recording medium according to any one of (1) to (10), wherein a content of the oxide of Bi in the recording layer is 10 nm or more in terms of a film thickness of a thin film.

(12)
A manufacturing method of an optical recording medium, including:
forming a recording layer by sputtering a target while introducing a process gas,
wherein the target contains an oxide of Bi,
wherein the process gas contains a rare gas and oxygen, and
wherein a flow rate ratio of the oxygen to the rare gas (an oxygen flow rate/a rare gas flow rate) is 0.15 or more.

(13)
A recording material for an optical recording medium, containing:
an oxide of Bi.

(14)
A sputtering target for an optical recording medium, containing:
an oxide of Bi.

2. Examples

Hereinafter, the present disclosure will be specifically described with reference to examples, but the present disclosure is not limited to these examples.

2-1. Evaluation Device and Evaluation Method of Signal Characteristics (Evaluation Device of Signal Characteristics)

In the present example, the evaluation of the optical disc was performed using an evaluation device for BD. In addition, in the present example, since verification of the characteristics of the recording material is the key, an optical disc having only one information recording layer (a so-called single-layer disc) was adopted as the optical disc.

Figure 5:
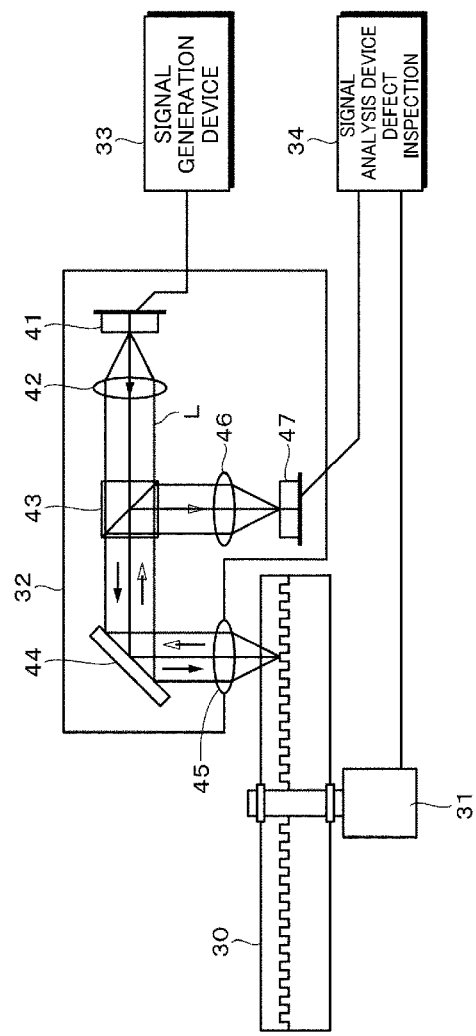
FIG. 5 is a schematic diagram showing a configuration of a disc drive type evaluation device.

FIG. 5 shows a configuration of a disc drive type evaluation device. Hereinafter, with reference to FIG. 5, the operation and procedure from the time when an optical disc 30 to be evaluated is mounted on the disc drive type evaluation device to the time when a signal is evaluated will be described.

First, the optical disc 30 is attached to a spindle motor unit 31 and rotated. Next, in a recording and reproducing optical system 32, a laser diode 41 emits light, and the laser light L is incident on a mirror 44 via a collimator lens 42 and a beam splitter 43. The laser light L reflected by the mirror 44 is incident on a recording layer of the optical disc 30 via an objective lens 45 while being condensed.

Next, the objective lens 45 is vertically moved in a direction (an optical axis direction) perpendicular to a light irradiation surface of the optical disc 30 to focus the laser light L on the recording layer of the optical disc 30. At this time, the laser light L reflected by the recording layer of the optical disc 30 returns along a path it has traveled, and some or all of the laser light L is reflected by the beam splitter 43 of the recording and reproducing optical system 32 and is incident on a photodetector 47 via a condensing lens 46. The light received by the photodetector 47 is converted into an electric signal and supplied to a signal analysis device 34. The signal analysis device 34 generates an error signal for a focus servo, an error signal for a tracking servo, an RF signal, and the like on the basis of the electric signal supplied from the photodetector 47 and performs servo control and the like on the basis of these generated signals. For example, in the control of the focus servo, a focus error signal is used to control the operation of the focus servo such that a focus of the laser light is always positioned on the recording layer. Further, the tracking error signal is used to control such that the focus of the laser light is positioned on ae convex portion (Gon) of a guide groove on the recording layer. With the processing up to this point, preparation for information recording is completed. Further, if the information signal has already been recorded on the optical disc 30, the information signal can be read (reproduced) from the optical disc 30.

The information signal is recorded on the optical disc 30 as follows. A signal generation device 33 controls laser light emission from a laser diode 41 on the basis of an information signal to be recorded on the optical disc 30. As a result, an emission waveform of the laser light L emitted from the laser diode 41 is controlled, and the recording layer of the optical disc 30 is irradiated with the laser light L. The recording layer irradiated with the laser light L changes due to laser energy thereof. In the recording layer of the present example, the laser energy decomposes a metal oxide (for example, BiOx) to generate $O_2$, which causes a refractive index change and a physical volume expansion of the recording layer. It is assumed that the laser light L supplies sufficient energy to the recording layer to cause this change.

The information signal is reproduced from the optical disc 30 as follows. The information signal is reproduced with sufficiently low power that does not change the recording layer even if the same portion of the recording layer of the optical disc 30 is reproduced one million times by laser light irradiation, wherein the power allows the recorded information signal to be read with a sufficient S/N. The laser light set in this manner is called reproduction light, and the laser power at that time is called reproduction power. The reproduction light emitted onto the recording layer of the optical disc 30 travels backward through the recording and reproducing optical system and is detected by the photodetector 47. Examples of a system of the optical disc 30 include a system in which the amount of light returned from the recorded portion is lower than the amount of light returned from the unrecorded portion and a system in which the amount of returned light from the recorded portion is higher than the amount of light returned from the unrecorded portion. The former is called a high-to-low recording system, and the latter is called a low-to-high recording system.

The optical disc 30 of the present example is a medium for high-to-low recording and is used for CDs, DVDs, and BDs. The light detected by the photodetector 47 is supplied to the signal analysis device 34, and the signal quality is evaluated by the signal analysis device 34.

[Evaluation Method of Signal Characteristics]

An object of the present example is to provide a recording material with high reproduced signal quality in addition to reduction in disc production bit cost. Examples of an index indicating the reproduced signal quality include various evaluation indexes such as a general signal-to-noise ratio (SNR), a carrier-to-noise ratio (CNR) for easier evaluation of the SNR, and crosstalk which is an evaluation index of a signal level at which a recorded signal of an adjacent track leaks into a signal level of a reproduction track used in the case of an optical disc. Here, a method for evaluating the CNR and the crosstalk will be described.

The recorded and reproduced signal evaluation of the optical disc was performed as follows using the above evaluation device for BD. A channel clock used for recording data on an optical disc was set to 132 MHz, and one period of this clock was set to 1T. A recording linear velocity was set to 4.48 m/sec. A wavelength λ of the recording and reproducing laser light was set to 405 nm. NA of the objective lens used for laser condensing was set to 0.85. As a recording system, a so-called land/groove recording system in which data are recorded in both convex grooves and concave lands on a light incident side was used. The land was formed on the track adjacent to the groove. A track pitch was an interval between the centers of the groove and the land.

The crosstalk was evaluated as follows. The leakage amount of the signal recorded in the groove into the adjacent track (land) was evaluated. A signal with a mark length/space length of 12T was recorded in the groove. This was used as a 12T mono-carrier signal. In recording the 12T mono-carrier signal, a method in which the emission waveform of the laser light is fixed and the power level is uniformly adjusted was used. An amplitude modulation degree of the 12T mono-carrier signal was fixed at 50%. A reproduction beam was disposed in the land adjacent to this signal, and the amplitude of the signal leaking from the groove was observed with an oscilloscope and obtained as an amplitude voltage value Vpp. On the other hand, the reproduction beam was disposed in the land at a location where recording is performed in neither the groove nor the land, and a signal level Iv at the time of being unrecorded was obtained as a voltage level. The leakage amount CT was defined as CT=Vpp/Iv.

The CNR was evaluated as follows. In the case of evaluating the quality of the signal recorded in the groove, a single-frequency signal (a mono-carrier) was recorded in the groove. No signal was recorded in the land of an adjacent track. A carrier level and a noise level of the mono-carrier reproduced signal were measured with a spectrum analyzer using the reproduced signal obtained from the photodetector 47. In order to compare the recording layers when recording the mono-carrier, it is desirable to adjust the light amount of the reproducing laser light L such that a value obtained by normalizing the modulation degree (the amplitude) of the signal from the photodetector 47 detected as a direct current (DC) with the signal level at the time of being unrecorded is constant and the signal amplitude becomes constant.

The modulation degree was fixed at 50%. Further, regarding the noise level, the noise components are known to be media noise caused by the recording surface of the optical disc, laser noise, shot noise caused by light hitting the photodetector 47, and thermal noise of a reproduction signal circuit system, but it is desirable to appropriately select the mono-carrier frequency and the laser power such that media noise becomes the main component and then fix them for measurement and comparison between optical discs. In the present example, the 12T mono-carrier signal was used.

In a state where the mono-carrier frequency and the laser power was adjusted as described above, a carrier level C (dBm) of the mono-carrier reproduction signal and the media noise N (dBm) in the vicinity of the frequency thereof are measured, and the CNR was calculated by CNR=(C−N) (dB). In a case where there is a difference in CNR with this method, the main factor is that the media noise level changes due to recording. Therefore, in order to improve the CNR, it is necessary to search for a recording material that can curb the media noise even during recording.

2-2. Metal Oxide to Replace Mn-Based Oxide

In order to search for a recording material that can replace a Mn-based oxide, the optical constants of the oxides of Mn, V, Cr, Bi, Te, Cu, Ag, W, Zn, Sn, Zr, Ge, Mg, Mo, Ti, Sb, Nb, and Ta were investigated.

Example 1-1, Reference Examples 1-1 to 1-17

A silicon wafer sample was prepared by forming a recording layer with a thickness of 30 nm on a silicon wafer by a sputtering method. At this time, the film formation time required to form a recording layer with a thickness of 30 nm was measured. The results are shown in Table 1.

As a material for the recording layer, 18 kinds of metal oxides (oxides of Mn, V, Cr, Bi, Te, Cu, Ag, W, Zn, Sn, Zr, Ge, Mg, Mo, Ti, Sb, Nb, and Ta) shown in Table 1 were used.

[Evaluation]

The optical constants (the refractive index n and the extinction coefficient k) of the recording layer formed as described above were measured with an ellipsometer. The results are shown in Table 1.

[Evaluation Results]

Table 1 shows the evaluation results of the optical constants and the measurement results of the film formation time. Here, the optical constants are values at a wavelength of 405 nm.

TABLE 1

| | Recording material | Refractive index n | Extinction coefficient k | Film formation condition (For 30 nm) | |
|---|---|---|---|---|---|
| | | | | Power(W) | Time(sec) |
| Reference example1-1 | MnOx | 2.32 | 1.25 | 317 | 600 |
| Reference example1-2 | VOx | 2.65 | 0.63 | 396 | 1200 |
| Reference example1-3 | CrOx | 2.33 | 0.42 | 358 | 500 |
| Example1-1 | BiOx | 2.44 | 0.30 | 167 | 140 |
| Reference example1-4 | TeOx | 1.98 | 0.03 | 65 | 140 |
| Reference example1-5 | CuOx | 2.26 | 0.87 | 295 | 140 |
| Reference example1-6 | AgOx | 2.93 | 0.37 | 70 | 140 |
| Reference example1-7 | WOx | 2.38 | 0.00 | 250 | 140 |
| Reference example1-8 | ZnOx | 2.17 | 0.00 | 296 | 140 |
| Reference example1-9 | SnOx | 1.79 | 0.01 | 98 | 200 |
| Reference example1-10 | ZrOx | 2.00 | 0.01 | 296 | 1000 |
| Reference example1-11 | GeOx | 1.80 | 0.00 | 266 | 140 |
| Reference example1-12 | MgOx | 1.67 | 0.02 | 374 | 700 |
| Reference example1-13 | MoOx | 2.44 | 0.04 | 400 | 203 |
| Reference example1-14 | TiOx | 2.62 | 0.00 | 400 | 2162 |
| Reference example1-15 | SbOx | 2.00 | 0.01 | 200 | 110 |
| Reference example1-16 | NbOx | 2.45 | 0.00 | 400 | 576 |
| Reference example1-17 | TaOx | 2.53 | 0.01 | 392 | 500 |

From Table 1, it is found that VOx, CrOx, BiOx, CuOx, and AgOx exhibit light absorption in addition to MnOx.

Optical discs were produced in the following manner using the metal oxides, which were confirmed to exhibit light absorption as described above, as the recording materials.

Example 2-1, Reference Examples 2-1 to 2-5

First, a polycarbonate substrate having a thickness of 1.1 mm was formed by injection molding. On this polycarbonate substrate, a recording track was formed in a spiral shape with a convex portion and a concave portion. A spiral track of the convex portion is defined as a groove, and a spiral track of the concave portion is defined as a land. Next, a first protective layer, a recording layer, and a second protective layer were sequentially stacked on the uneven surface of the polycarbonate substrate by a sputtering method.

A specific configuration of each layer is as follows.

Second protective layer (light transmitting layer side)
Material: SIZ composite oxide (Si:In:Zr=20:50:30 (mol % ratio))
Thickness: 10 nm Recording layer
Material: Metal oxides (MnOx, VOx, CrOx, BiOx, CuOx, AgOx) shown in Table 2 were used as a recording material. In the film forming process by the sputtering method, the process gas conditions (Ar+$O_2$) were adjusted such that tetravalent Mn was generated in the Mn-based oxide. In addition, an excessive amount of $O_2$ was input to oxidize the metal element, and an oxide film was formed by reactive sputtering.
Thickness: 30 nm First protective layer (substrate side)
Material: SIZ composite oxide (Si:In:Zr=20:50:30 (mol % ratio))
Thickness: 10 nm Next, an ultraviolet curable resin was uniformly applied onto the second protective layer by a spin coating method and cured by irradiation with an ultraviolet ray to form a light transmitting layer having a thickness of 100 μm. As described above, the intended optical disc was obtained.

(Evaluation)

The reflectance, transmittance, absorption rate, and recorded and reproduced signal quality of the optical disc obtained as described above were evaluated. Further, a sputtering rate of the recording material used for the optical disc was calculated. The details of these evaluation methods and calculation methods are as follows.

(Reflectance)

A reproduced signal of the optical disc was obtained using an optical disc inspection device, and the reproduced signal level was converted into reflectance R.

(Transmittance)

Transmittance T was calculated from comparison with a standard value of a transmittance reference sample. An ellipsometer was used as a measuring device.

(Absorption Rate)

The absorption rate (1−R−T) was obtained using the above reflectance R and transmittance T.

(Sputtering Rate)

For MOx, VOx, CrOx, BiOx, CuOx, and AgOx, a film formation speed at a film formation power of 1 kW (a sputtering rate (hereinafter referred to as "sputtering rate (1)")) was obtained using the film formation time data and the extinction coefficient k in Table 1, and a sputtering rate (hereinafter referred to as "sputtering rate (2)") obtained on the assumption that a layer having the same light absorption is formed with the same deposition power was digitized as a relative value with respect to the Mn oxide. The results are shown in Table 2. When the optical characteristics of an optical disc are designed, especially in the case of a multi-layer optical disc, it is important to control the light transmittance and recording power of each recording layer, and the control is often performed from the viewpoint of the light absorption rate, and thus the data from the viewpoint of the same light absorption amount is shown in Table 2. Sputtering rate (1) in Table 2 was calculated as in the following expression using the data in Table 1.

Sputtering rate (nm/kW/sec)=(film thickness 30 nm)/
film formation time (sec)/film formation power
(W)×1000

Sputtering rate (2) in Table 2 was calculated as in the following expression using the data in Table 2.

Sputtering rate (normalized by Mn)=(1−R−T)×(nm/
kW/sec)/[(1−R−T) of MnOx×(nm/kW/sec)]

(Recorded and Reproduced Signal Quality)

The CNR and CT of the optical disc were measured using a method described in the above [2-1. Evaluation Device and Evaluation Method of Signal Characteristics].

[Evaluation Results]

Table 2 shows evaluation results of the reflectance R, the transmittance T, the absorption rate (1−R−T), the recorded and reproduced signal quality, and the sputtering rate.

TABLE 2

|  | Recording material | Reflectance R (%) | Transmittance T (%) | Absorption rate 1-R-T (%) | Sputtering rate(1) (nm/kW/sec) | Sputtering rate(2) (Relative value) |
|---|---|---|---|---|---|---|
| Reference example2-1 | MnOx | 12 | 32 | 56 | 0.16 | 1.0 |
| Reference example2-2 | VOx | 13 | 56 | 31 | 0.06 | 0.4 |
| Comparative Example2-3 | CrOx | 8 | 63 | 29 | 0.17 | 1.1 |
| Example2-1 | BiOx | 10 | 71 | 20 | 1.28 | 8.0 |
| Reference example2-4 | CuOx | 12 | 45 | 43 | 0.73 | 4.6 |
| Reference example2-5 | AgOx | 19 | 50 | 31 | 3.06 | 19.1 |

In Table 2, the evaluation result (Sputtering rate (1)) of BiOx ($Bi_2O_3$) is that of an optical disc with a recording layer formed by RF sputtering, and the evaluation results of metal oxides other than BiOx are those of optical discs having a recording layer formed by DC sputtering. It is known that in a case where the RF sputtering and the DC sputtering are performed with the same power to form a thin film, a RF sputtering rate is half a DC sputtering rate. Therefore, when the correction is included, the order in speed of the sputtering rates of the metal oxides is as follows.

Oxide of Ag>Oxide of Bi>Oxide of Cu>Oxide of Cr>Oxide of Mn>Oxide of V The sputtering rates of the oxides of Ag, Bi, and Cu were 19.1 times, 8.0 times, and 4.6 times the sputtering rate of the Mn oxide, respectively.

Figure 6:
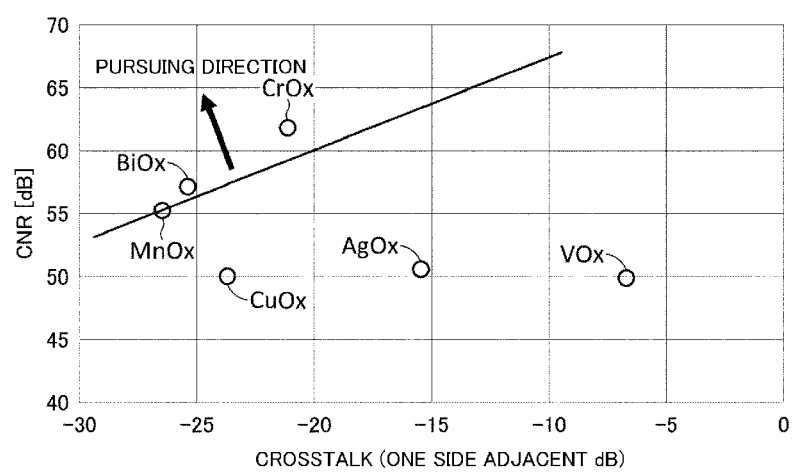
FIG. 6 is a graph showing crosstalk-CNR characteristics.
Figure 7A:
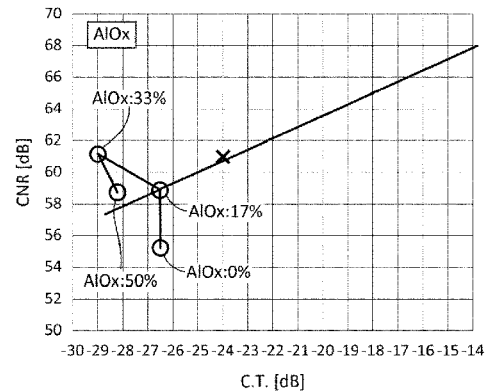
FIGS. 7A, 7B, and 7C are graphs showing crosstalk-CNR characteristics.
Figure 7B:
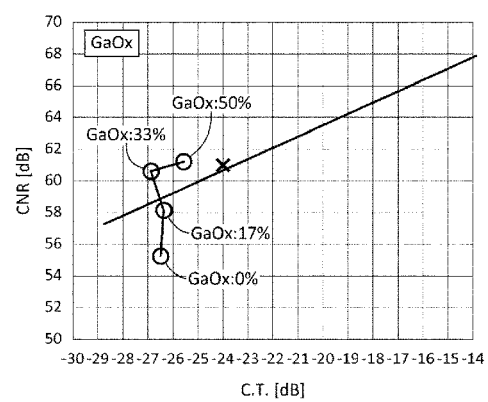
Figure 7C:
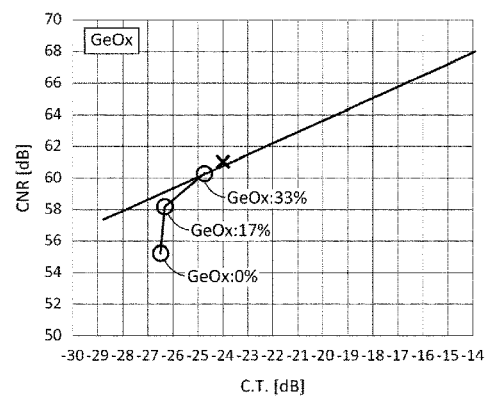
Figure 8A:
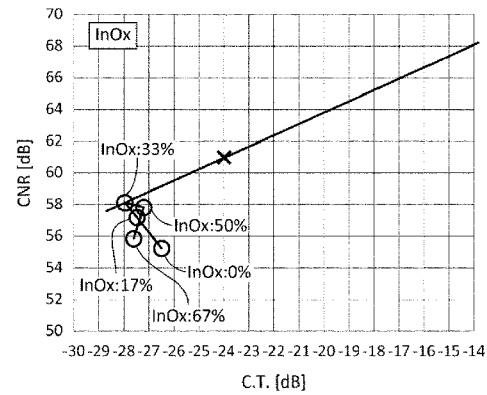
FIGS. 8A, 8B, and 8C are graphs showing crosstalk-CNR characteristics.
Figure 8B:
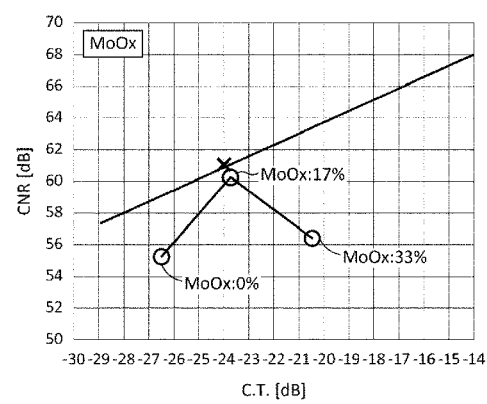
Figure 8C:
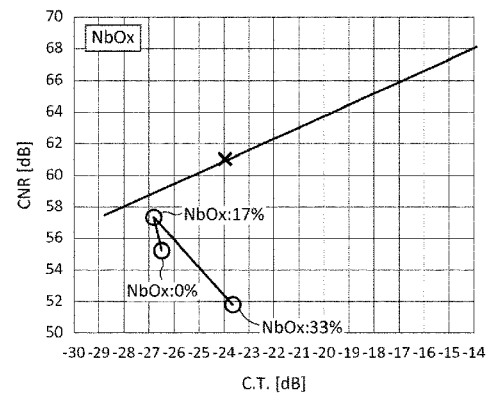
Figure 9A:
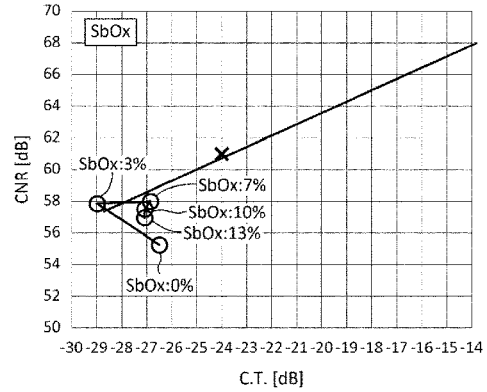
FIGS. 9A, 9B, and 9C are graphs showing crosstalk-CNR characteristics.
Figure 9B:
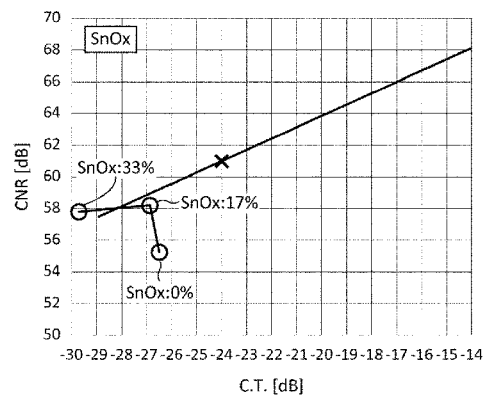
Figure 9C:
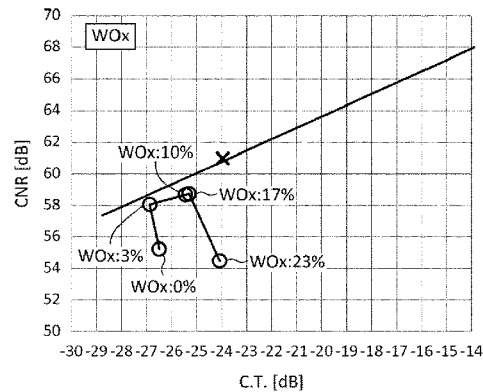
Figure 10A:
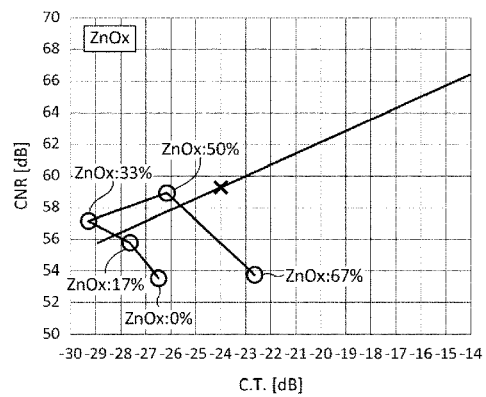
FIGS. 10A and 10B are graphs showing crosstalk-CNR characteristics.
Figure 10B:
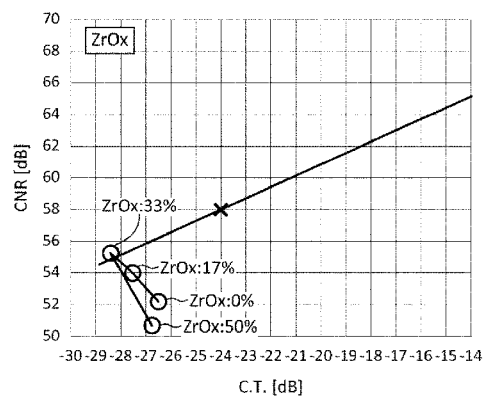

FIG. 6 shows the evaluation results of the CNR and CT. The higher the CNR value, the better, and the lower the CT value, the better. Therefore, it can be determined that the higher the plot of the graph is located in the upper left, the better the basic performance as a recording material. It is also known that even if the CNR is lowered, the final signal quality including the crosstalk is canceled out if the CT is also lowered. In the experimental environment of the present example, a decrease (worsening) of the CNR of 7.5 dB is offset by a decrease (improvement) of the CT of 10 dB. A straight line graph in FIG. 6 is a line drawn with a CNR/CT inclination of 7.5 dB/10 dB based on the evaluation result (plot) of the Mn oxide, and it is shown that the recording material whose evaluation result (plot) is located above this line has better CT-CNR performance than the Mn oxide.

When it is determined from the above points, recording materials having better CT-CNR performance than the Mn oxide are oxides of Cr and Bi. Among these, the oxide of Cr is a recording material inferior in sputtering rate to the oxide of Mn, and thus the oxide of Bi is preferable as a recording material.

2-3. Influence of Additive Element on Recorded and Reproduced Signal Quality

An oxide of a metal M (an additive element) was added to each of the oxide of Bi and the oxide of Cu, and an influence of the oxide of a metal M on the recorded and reproduced signal quality was evaluated.

Examples 3-1 to 3-3, 4-1 to 4-3, 5-1, 5-2, 6-1 to 6-4, 7-1, 7-2, 8-1, 8-2, 9-1 to 9-4, 10-1, 10-2, 11-1 to 11-4, 12-1 to 12-4, 13-1 to 13-3

As shown in Table 3, the recording layer was formed from a composite oxide of the oxide of Bi (BiOx) and the oxide of a metal M (MOx (where M is Al, Ga, Ge, In, Mo, Nb, Sb, Sn, W, Zn, or Zr)). At this time, the volume ratio of the oxide of Bi (BiOx) and the oxide of a metal M (MOx) in the recording layer was set to the value shown in Table 3 by adjusting the film formation conditions. An optical disc was obtained in the same manner as in Example 1-1 except for the above.

TABLE 3

|  | Recording material | Content of BiOx (vol %) | Content of MOx (vol %) |
|---|---|---|---|
| Example2-1 | BiOx | 100 | 0 |
| Example3-1 | BiOx, AlOx | 83 | 17 |
| Example3-2 |  | 67 | 33 |
| Example3-3 |  | 50 | 50 |
| Example4-1 | BiOx, GaOx | 83 | 17 |
| Example4-2 |  | 67 | 33 |
| Example4-3 |  | 50 | 50 |
| Example5-1 | BiOx, GeOx | 83 | 17 |
| Example5-2 |  | 67 | 33 |

TABLE 3-continued

| | Recording material | Content of BiOx (vol %) | Content of MOx (vol %) |
|---|---|---|---|
| Example6-1 | BiOx, InOx | 83 | 17 |
| Example6-2 | | 67 | 33 |
| Example6-3 | | 50 | 50 |
| Example6-4 | | 33 | 67 |
| Example7-1 | BiOx, MoOx | 83 | 17 |
| Example7-2 | | 67 | 33 |
| Example8-1 | BiOx, NbOx | 83 | 17 |
| Example8-2 | | 67 | 33 |
| Example9-1 | BiOx, SbOx | 97 | 3 |
| Example9-2 | | 93 | 7 |
| Example9-3 | | 90 | 10 |
| Example9-4 | | 87 | 13 |
| Example10-1 | BiOx, SnOx | 83 | 17 |
| Example10-2 | | 67 | 33 |
| Example11-1 | BiOx, WOx | 97 | 3 |
| Example11-2 | | 90 | 10 |
| Example11-3 | | 83 | 17 |
| Example11-4 | | 77 | 23 |
| Example12-1 | BiOx, ZnOx | 83 | 17 |
| Example12-2 | | 67 | 33 |
| Example12-3 | | 50 | 50 |
| Example12-4 | | 33 | 67 |
| Example13-1 | BiOx, ZrOx | 83 | 17 |
| Example13-2 | | 67 | 33 |
| Example13-3 | | 50 | 50 |

Reference Examples 3-1 to 3-3, 4-1 to 4-3, 5-1 to 5-3, 6-1 to 6-3, 7-1, 7-2, 8-1 to 8-3, 9-1 to 9-4, 10-1 to 10-3, 11-1, 11-2, 12-1, 13-1 to 13-3

As shown in Table 4, the recording layer was formed from a composite oxide of the oxide of Cu (CuOx) and the oxide of a metal M (MOx (where M is Zr, Nb, Mo, W, Zn, Al, Ga, In, Ge, Sn, or Sb)). At this time, the volume ratio of the oxide of Cu (CuOx) and the oxide of a metal M (MOx) in the recording layer was set to the value shown in Table 4 by adjusting the film formation conditions. An optical disc was obtained in the same manner as in Example 1-1 except for the above.

TABLE 4

| | Recording material | Content of CuOx (vol %) | Content of MOx (vol %) |
|---|---|---|---|
| Reference example2-4 | CuOx | 100% | 0% |
| Reference example3-1 | CuOx, ZrOx | 10% | 90% |
| Reference example3-2 | | 17% | 83% |
| Reference example3-3 | | 33% | 67% |
| Reference example4-1 | CuOx, NbOx | 10% | 90% |
| Reference example4-2 | | 17% | 83% |
| Reference example4-3 | | 33% | 67% |
| Reference example5-1 | CuOx, MoOx | 17% | 83% |
| Reference example5-2 | | 33% | 67% |
| Reference example5-3 | | 50% | 50% |
| Reference example6-1 | CuOx, WOx | 17% | 83% |
| Reference example6-2 | | 33% | 67% |
| Reference example6-3 | | 50% | 50% |
| Reference example7-1 | CuOx, ZnOx | 17% | 83% |
| Reference example7-2 | | 50% | 50% |
| Reference example8-1 | CuOx, AlOx | 17% | 83% |
| Reference example8-2 | | 33% | 67% |
| Reference example8-3 | | 50% | 50% |
| Reference example9-1 | CuOx, GaOx | 17% | 83% |
| Reference example9-2 | | 33% | 67% |
| Reference example9-3 | | 50% | 50% |
| Reference example10-1 | CuOx, InOx | 10% | 90% |
| Reference example10-2 | | 17% | 83% |
| Reference example10-3 | | 33% | 67% |
| Reference example11-1 | CuOx, GeOx | 33% | 67% |
| Reference example11-2 | | 50% | 50% |
| Reference example12-1 | CuOx, SnOx | 17% | 83% |
| Reference example13-1 | CuOx, SbOx | 33% | 67% |
| Reference example13-2 | | 42% | 58% |
| Reference example13-3 | | 50% | 50% |

(Evaluation of Recorded and Reproduced Signal Quality)

The CNR and CT of the optical disc were measured using a method described in the above [2-1. Evaluation Device and Evaluation Method of Signal Characteristics].

Figure 11:
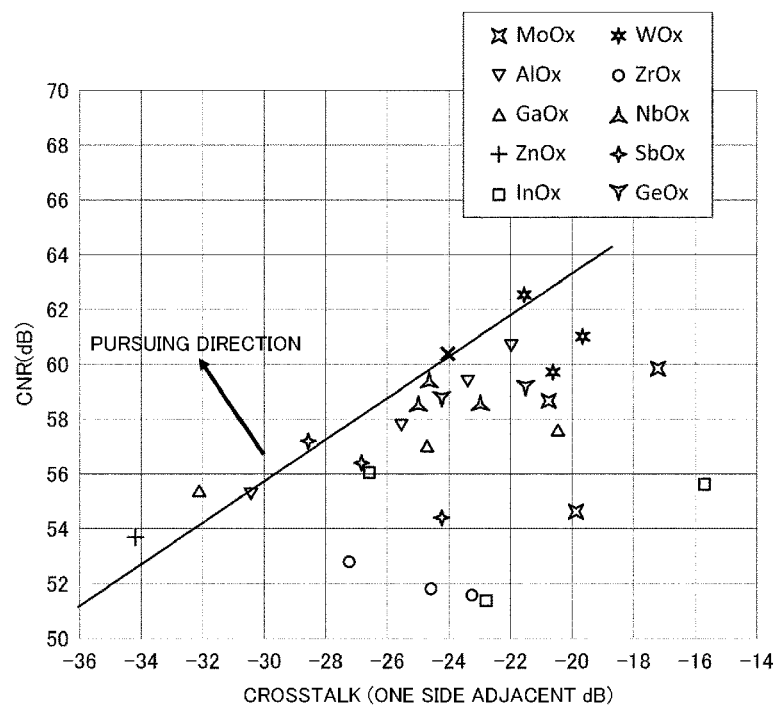
FIG. 11 is a graph showing crosstalk-CNR characteristics.

(Evaluation Results) FIGS. 7A, 7B, 7C, 8A, 8B, 8C, 9A, 9B, 9C, 10A, and 10B show evaluation results of optical discs using composite oxides of BiOx and MOx as recording materials. FIG. 11 shows evaluation results of optical discs using composite oxides of CuOx and MOx as recording materials. In FIGS. 7A, 7B, 7C, 8A, 8B, 8C, 9A, 9B, 9C, 10A, 10B, and 11, the data of the Mn-based oxide is marked with "x" for comparison. A straight line shown in each of FIGS. 7A, 7B, 7C, 8A, 8B, 8C, 9A, 9B, 9C, 10A, 10B, and 11 is a straight line drawn such that a CNR/CT inclination is 7.5 dB/10 dB based on the data of the Mn-based oxide, and the Bi-based oxide whose evaluation result (plot) is located above this line has better CT-CNR performance than the Mn-based oxide. "%" described in FIGS. 7A, 7B, 7C, 8A, 8B, 8C, 9A, 9B, 9C, 10A, and 10B and Table 4 means "vol %."

From FIGS. 7A, 7B, 7C, 8A, 8B, 8C, 9A, 9B, 9C, 10A, and 10B, it is found that in the Bi-based oxide, in a case where the oxide of Al, Ga, or Zn is used as the oxide of the additive metal M (MOx), the recorded and reproduced signal quality better than that of the Mn-based oxide is obtained. It is also found that in a case where the oxides of Ge, In, Sb, Mo, Sn, W, Zr, or Nb are used, the recorded and reproduced signal quality equivalent to that of the Mn-based oxide is obtained. Elements of the same group in the periodic table tend to exhibit the same chemical property, and it is conceivable that the recording material system of the present disclosure will exhibit the same tendency. Therefore, an oxide of Si, Ti, Hf, or Ta is also expected as the additive metal oxide (MOx) capable of obtaining excellent recorded and reproduced signal quality.

From FIG. 11, it is found that in the Cu-based oxide, in a case where the oxide of the additive metal M (MOx) is used, the recorded and reproduced signal quality equal to or lower than that of the Mn-based oxide is obtained.

2-4. Sputtering Gas Conditions of Bi-Based Oxide

A recording material using an oxide of Bi contains an oxide of Bi with a high valence and is characterized in that oxygen generated by recording energy expands the volume of the recording layer to obtain a difference in reflectance between a recorded portion and an unrecorded portion. In the following, it is shown that sputtering in oxygen-rich conditions is preferred.

Examples 14-1 to 14-5

A silicon wafer sample was prepared by forming a recording layer with a thickness of 30 nm on a silicon wafer by a sputtering method. $Bi_2O_3$ (Bi-based oxide) having a stoichiometric composition was used as a recording layer forming material (a target material), and Ar gas and $O_2$ gas were used as the process gas. The flow rate ratio of the Ar gas and the $O_2$ gas was adjusted as shown in Table 5 for each sample. Also, the input power for film formation was fixed.

Examples 15-1 to 15-5

An optical disc was obtained in the same manner as in Example 2-1 except that the recording layer was formed under the same film formation conditions as in Examples 14-1 to 14-5.
(Evaluation of Refractive Index and Extinction Coefficient)
The optical constants (the refractive index n, the extinction coefficient k) of the recording layer of the silicon wafer sample obtained as described above were measured with an ellipsometer.
(Evaluation of Signal Characteristics)
The CNR and CT of the optical disc obtained as described above were measured using a method described in the above <2-1. Evaluation Device and Evaluation Method of Signal Characteristics>.
(Cross-Sectional TEM Observation)
Cross-sectional TEM images of the optical disc obtained as described above were obtained in the unrecorded state and the recorded state.
(Evaluation Results of Optical Constants)
Table 5 shows the evaluation results of the optical constants of the recording layer. Here, the optical constants are values at a wavelength of 405 nm.

TABLE 5

| | Ar (sccm) | $O_2$ (sccm) | Flow rate ratio ($O_2$/Ar) | Refractive index | Extinction coefficient |
|---|---|---|---|---|---|
| Example14-1 | 30 | 50 | 1.67 | 2.44 | 0.30 |
| Example14-2 | 60 | 20 | 0.33 | 2.60 | 0.34 |
| Example14-3 | 70 | 10 | 0.14 | 2.75 | 0.33 |
| Example14-4 | 75 | 5 | 0.07 | 2.78 | 0.24 |
| Example14-5 | 77 | 3 | 0.04 | 2.93 | 0.10 |

Figure 12:
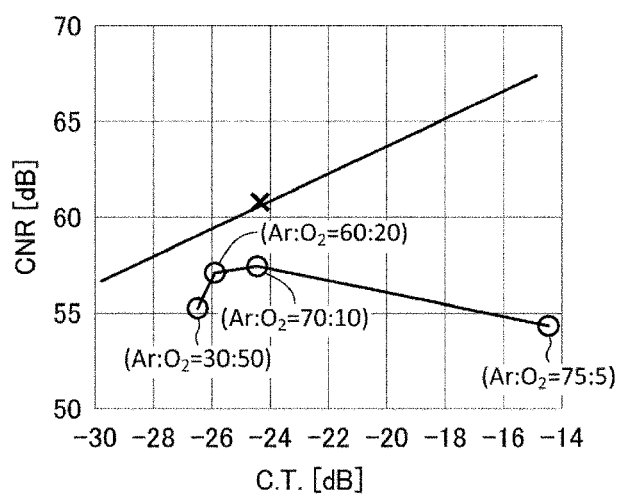
FIG. 12 is a graph showing crosstalk-CNR characteristics.

Table 5 shows a tendency that a transparent oxide of Bi is obtained in a region where the amount of oxygen is small during film formation and the extinction coefficient increases as the amount of oxygen increases and saturates when the amount of oxygen exceeds a certain level. On the other hand, the refractive index tends to decrease as the amount of oxygen increases. Therefore, it is found that it is preferable to input a large amount of oxygen in order to make the oxide of Bi have the light absorption capability in the film formation by sputtering.
(Evaluation Results of Signal Characteristics) FIG. 12 shows the evaluation results of the signal characteristics of the optical disc. In FIG. 12, the data of the Mn-based oxide is marked with "x" for comparison as in FIGS. 7A, 7B, 7C, 8A, 8B, 8C, 9A, 9B, 9C, 10A, and 10B and the like. In addition, a straight line which is the same as that in each of FIGS. 7A, 7B, 7C, 8A, 8B, 8C, 9A, 9B, 9C, 10A, and 10B and the like is shown. From FIG. 12, it is found that increasing the amount of oxygen significantly reduces the CT value and improves the CT-CNR performance. In the flow rate ratio of the Ar gas and the O2 gas (the O2 gas flow rate/the Ar gas flow rate) in sputtering, the gas flow rate ratio (the O2 flow rate/the Ar flow rate) is preferably 0.15 or more in order to ensure the recorded and reproduced signal characteristics.

Figure 13A:
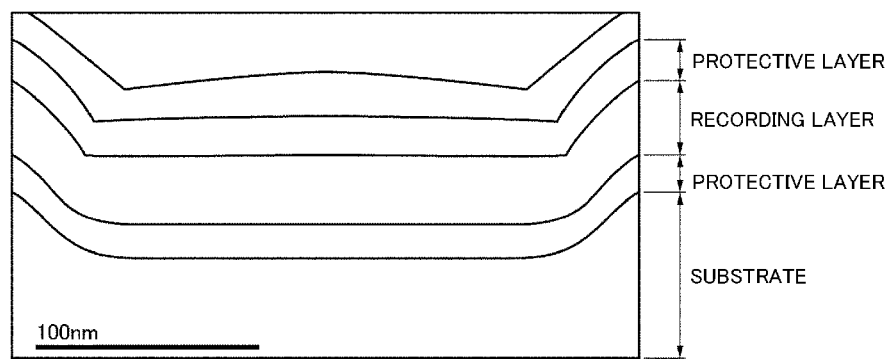
FIG. 13A is a schematic view of a cross-sectional TEM image of an optical disc in an unrecorded state.
Figure 13B:
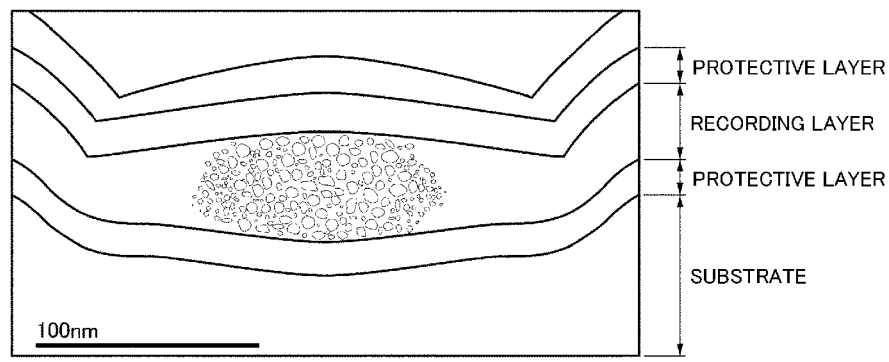
FIG. 13B is a schematic view of a cross-sectional TEM image of an optical disc in a recorded state.
Figure 14A:
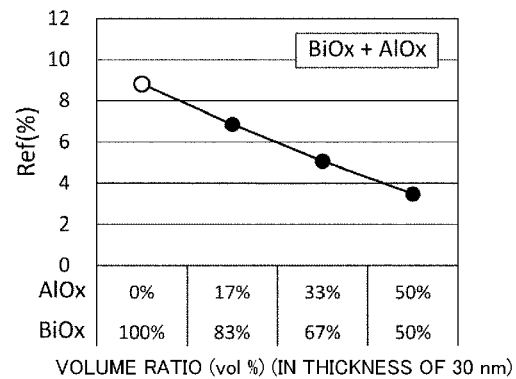
FIGS. 14A, 14B, and 14C are graphs showing a relationship between a volume ratio and reflectance of a metal oxide.
Figure 14B:
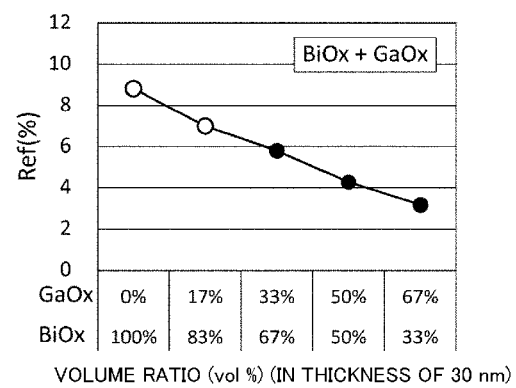
Figure 14C:
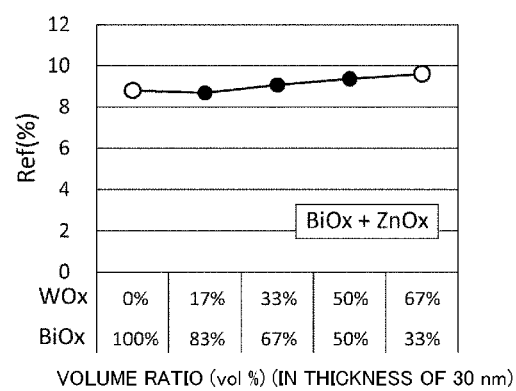
Figure 15A:
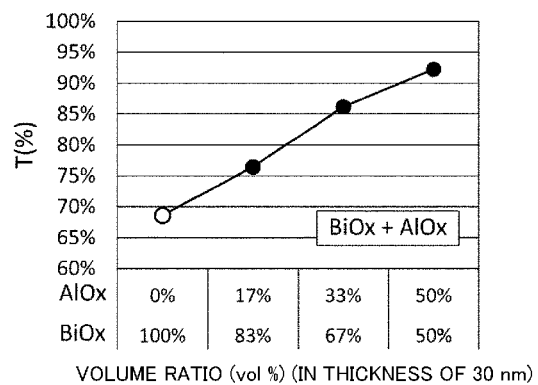
FIGS. 15A, 15B, and 15C are graphs showing a relationship between a volume ratio and reflectance of a metal oxide.
Figure 15B:
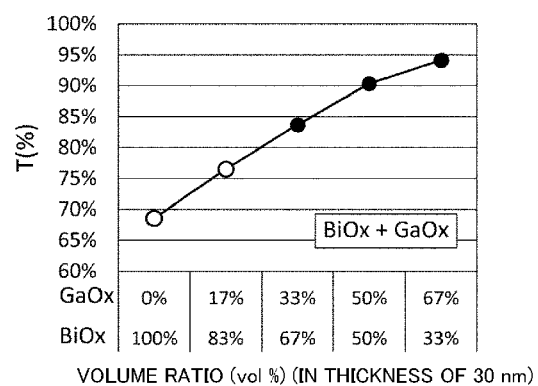
Figure 15C:
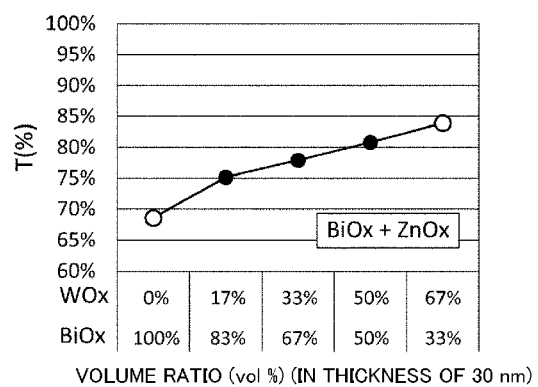

(Observation Results of Cross-Sectional TEM Image)
A schematic view of a cross-sectional TEM image in an unrecorded state is shown in FIG. 13A. A schematic view of a cross-sectional TEM image in a recorded state is shown in FIG. 13B. These cross-sectional TEM images are images of the optical disc of Example 14-2 in which the flow rate ratio of the Ar gas and the $O_2$ gas is (Ar:$O_2$)=(60:20). From the results of observation of the above cross-sectional TEM image, it was found that the recorded mark of the optical disc expanded and became spindle-shaped as shown in FIG. 13B.

In this expansion region, from the viewpoint of an optical film, the film thickness increases, and the material density in the space decreases due to the expansion, and thus the refractive index also decreases. Moreover, it is reasonable to consider that the recording material undergoes a chemical change such as thermal reaction or thermal decomposition due to the recording, and this chemical change is also included in a change in the refractive index. As a result, a change in the amount of reflected light with respect to information reproduction light occurs between the recorded portion and the unrecorded portion.

The valence of the oxide of Bi before and after the recording was analyzed by XPS, but no other than trivalent Bi could be detected. Actually, since the recorded and reproduced signal characteristics change depending on the flow rate of oxygen during film formation, tetravalent Bi may be generated in the oxide of Bi at the time of being unrecorded.

From the above, it was found that the oxide of Bi is preferably formed into a film under the condition of excess oxygen, and the oxide of Bi is a useful recording material as an initiator.

2-5. Amount of Oxide of Bi for Ensuring Excellent Recorded and Reproduced Signal Characteristics The amount of BiOx was estimated to secure the recorded and reproduced signal characteristics and to obtain the reflectance and transmittance for use in a multi-layer optical disc. Here, notation of a film thickness was used. Since a recording mode utilizes the expansion of the recording material, the amount of reproduced signal depends on the amount of oxygen released from a reactant BiOx. In the case of notation of a composition ratio, the number of elements varies greatly even if the composition ratio is the same, depending on the types of other additive elements in the recording material, and thus a film thickness conversion value linked to the amount of oxygen released was used.

FIGS. 7A, 7B, 7C, 8A, 8B, 8C, 9A, 9B, 9C, 10A, and 10B show the CT-CNR characteristics with respect to the MOx amount in the recording layer, and the MOx amount is shown in volume ratio (vol %) in the graph. Further, since the thickness of the recording layer used in the optical disc is 30 nm, the content of BiOx in the recording layer can be obtained as a film thickness conversion amount, and a film thickness conversion value was 10 nm or more and 29 nm or less (<30 nm). The reflectance and transmittance at this time are shown in FIGS. 14A, 14B, 14C, 15A, 15B, and 15C, respectively. The black plots in the figure are compositional data that ensure CT-CNR characteristics equal to or higher than those of the Mn-based recording material used as a comparison standard. From this data, it is found that the reflectance can be adjusted in the range of 3% to 9%, the transmittance can be adjusted in the range of 75% to 90%, and it is possible to match them to the optical characteristics of each recording layer of the multi-layer optical disc.

REFERENCE SIGNS LIST

10 Optical recording medium
11 Substrate
12 Light transmitting layer
21 Recording layer
22, 23 Protective layer
L0 to Ln Information signal layer
S1 to Sn Intermediate layer
Gon Groove (track of convex portion of guide groove)
Gin Land (track of concave portion of guide groove)
C Light irradiation surface

The invention claimed is:

1. An optical recording medium, comprising:
at least one recording layer, wherein
the recording layer contains an oxide of Bi and an oxide of Al, and
a ratio of a first amount of the oxide of Al in the recording layer to a second amount of the oxide of Bi and the oxide of Al in the recording layer is 15 vol % or more and 50 vol % or less.

2. The optical recording medium according to claim 1, wherein the recording layer further contains at least one selected from the group consisting of oxides of Mg, Si, Ti, V, Cr, Mn, Fe, Co, Ni, Cu, Zn, Ga, Ge, Se, Y, Zr, Nb, Mo, Ru, Pd, Ag, In, Sn, Sb, Te, Hf, Ta, W, and Pb.

3. The optical recording medium according to claim 1, wherein the recording layer further contains at least one selected from the group consisting of oxides of Cu, Zr, Nb, Sn, Ta, W, Ge, In, Sb, and Mo.

4. The optical recording medium according to claim 1, wherein the recording layer further contains at least one selected from the group consisting of oxides of Ga and Zn.

5. The optical recording medium according to claim 1, wherein the recording layer does not contain Mn.

6. The optical recording medium according to claim 1, wherein the recording layer does not contain Pd.

7. The optical recording medium according to claim 1, wherein the recording layer contains neither Mn nor Pd.

8. The optical recording medium according to claim 1, wherein
the recording layer further contains an oxide of Ga, and
a content of the oxide of Ga in the recording layer is 17 vol % or more and 67 vol % or less.

9. The optical recording medium according to claim 1, wherein
the recording layer further contains an oxide of Zn, and
a content of the oxide of Zn in the recording layer is 17 vol % or more and 55 vol % or less.

10. The optical recording medium according to claim 1, wherein a content of the oxide of Bi in the recording layer is 10 nm or more in terms of a film thickness of a thin film.

11. A manufacturing method of an optical recording medium, comprising:
forming a recording layer by sputtering a target while introducing a process gas, wherein
the target contains an oxide of Bi and an oxide of Al,
a ratio of a first amount of the oxide of Al in the target to a second amount of the oxide of Bi and the oxide of Al in the target is 15 vol % or more and 50 vol % or less,
the process gas contains a rare gas and oxygen, and
a flow rate ratio of the oxygen to the rare gas (an oxygen flow rate/a rare gas flow rate) is 0.15 or more.

12. A recording material for an optical recording medium, containing:
an oxide of Bi; and
an oxide of Al, wherein
a ratio of a first amount of the oxide of Al in the recording material to a second amount of the oxide of Bi and the oxide of Al in the recording material is 15 vol % or more and 50 vol % or less.

13. A sputtering target for an optical recording medium, containing:
an oxide of Bi; and
an oxide of Al, wherein
a ratio of a first amount of the oxide of Al in the sputtering target to a second amount of the oxide of Bi and the oxide of Al in the sputtering target is 15 vol % or more and 50 vol % or less.

* * * * *